(12) United States Patent
Kida et al.

(10) Patent No.: US 12,114,537 B2
(45) Date of Patent: Oct. 8, 2024

(54) DISPLAY ELEMENT

(71) Applicant: SHARP KABUSHIKI KAISHA, Sakai (JP)

(72) Inventors: Sentaro Kida, Sakai (JP); Shigeru Aomori, Sakai (JP); Tsuyoshi Kamada, Sakai (JP); Yasushi Asaoka, Sakai (JP); Jun Sakuma, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 518 days.

(21) Appl. No.: 17/598,162

(22) PCT Filed: Mar. 28, 2019

(86) PCT No.: PCT/JP2019/013855
§ 371 (c)(1),
(2) Date: Sep. 24, 2021

(87) PCT Pub. No.: WO2020/194738
PCT Pub. Date: Oct. 1, 2020

(65) Prior Publication Data
US 2022/0173181 A1     Jun. 2, 2022

(51) Int. Cl.
*H01L 21/78*        (2006.01)
*H10K 50/822*       (2023.01)
(Continued)

(52) U.S. Cl.
CPC ......... *H10K 59/122* (2023.02); *H10K 50/822* (2023.02); *H10K 50/865* (2023.02);
(Continued)

(58) Field of Classification Search
CPC .. H10K 59/122; H10K 50/822; H10K 50/865; H10K 50/828; H10K 59/1201;
(Continued)

(56) References Cited

U.S. PATENT DOCUMENTS

| 6,420,834 | B2 * | 7/2002 | Yamazaki | H10K 71/166 |
| | | | | 315/169.3 |
| 6,948,993 | B2 * | 9/2005 | Yi | H10K 59/173 |
| | | | | 445/24 |
| 7,365,367 | B2 * | 4/2008 | Han | H10K 71/135 |
| | | | | 257/40 |
| 9,018,621 | B2 * | 4/2015 | Park | H10K 59/122 |
| | | | | 438/82 |

(Continued)

FOREIGN PATENT DOCUMENTS

| JP | 2005-338796 A | 12/2005 |
| JP | 2010-009793 A | 1/2010 |

(Continued)

*Primary Examiner* — Vu A Vu
(74) *Attorney, Agent, or Firm* — ScienBiziP, P.C.

(57) ABSTRACT

Provided is a display element according to an aspect of the disclosure including a flattening film and, on the flattening film, a plurality of banks each having a linear shape, a plurality of active layers each having a linear shape and formed between adjacent banks, and an upper transparent electrode formed on each of the plurality of active layers. A cut line having a locally reduced height with reference to the flattening film is formed in each the plurality of banks, and the upper transparent electrode formed on one of the adjacent active layers and the upper transparent electrode formed on the other of the adjacent active layers are electrically connected via a conductive electrode formed in the cut line.

21 Claims, 17 Drawing Sheets

(51) Int. Cl.
*H10K 50/86* (2023.01)
*H10K 59/122* (2023.01)
*H10K 50/828* (2023.01)
*H10K 59/12* (2023.01)
*H10K 59/131* (2023.01)
*H10K 71/00* (2023.01)
*H10K 102/00* (2023.01)

(52) U.S. Cl.
CPC ....... *H10K 50/828* (2023.02); *H10K 59/1201* (2023.02); *H10K 59/131* (2023.02); *H10K 71/00* (2023.02); *H10K 2102/3026* (2023.02)

(58) Field of Classification Search
CPC ................. H10K 59/131; H10K 71/00; H10K 2102/3026; H10K 71/861; G09F 9/30; H05B 33/12; H05B 33/22; H05B 33/28
USPC .......................................................... 257/72
See application file for complete search history.

(56) References Cited

U.S. PATENT DOCUMENTS

| | | | | |
|---|---|---|---|---|
| 9,478,591 | B2* | 10/2016 | Nam | H10K 50/824 |
| 9,911,796 | B2* | 3/2018 | Matsumoto | H10K 59/38 |
| 10,026,790 | B2* | 7/2018 | Kim | H10K 50/828 |
| 10,553,622 | B2* | 2/2020 | Lee | H10K 59/126 |
| 11,315,986 | B2* | 4/2022 | Kim | H10K 59/80521 |
| 2005/0242713 | A1 | 11/2005 | Yamazaki | |
| 2013/0056784 | A1* | 3/2013 | Lee | H10K 59/1315 438/22 |
| 2017/0186825 | A1 | 6/2017 | Matsumoto | |
| 2019/0074470 | A1 | 3/2019 | Takagi | |

FOREIGN PATENT DOCUMENTS

| | | |
|---|---|---|
| JP | 2016085796 A | 5/2016 |
| JP | 2017-117767 A | 6/2017 |
| JP | 2018-045873 A | 3/2018 |
| JP | 2019047056 A | 3/2019 |

\* cited by examiner (a)

(b)

(c)

DISPLAY ELEMENT

TECHNICAL FIELD

The disclosure relates to a display element.

BACKGROUND ART

PTL 1 discloses a display element in which an anode electrode, a light-emitting mediation layer, and a cathode electrode are layered between adjacent inversely tapered partitions.

CITATION LIST

Patent Literature

PTL 1: JP 2018-45873 A (published on Mar. 22, 2018)

SUMMARY

Technical Problem

In the configuration of PTL 1, there is a problem in that pixel defects occur in a linear shape in a case in which a cathode electrode having a linear shape is disconnected.

Solution to Problem

A display element according to an aspect of the disclosure includes a flattening film, a plurality of lower reflective electrodes, a plurality of banks each having a linear shape, a plurality of active layers each having a linear shape and formed between adjacent banks of the plurality of banks, and an upper transparent electrode formed on each of the plurality of active layers. The plurality of lower reflective electrodes, the plurality of banks, the plurality of active layers, and the upper transparent electrode are on an upper side of the flattening film. Each of the plurality of active layers is provided in common to the plurality of lower reflective electrodes and constitutes a plurality of same color pixels. Each of the plurality of banks is inversely tapered toward the flattening film side. A height of each of the plurality of banks with reference to the flattening film is greater than a height of the upper transparent electrode with reference to the flattening film. One or more cut lines having a locally reduced height with reference to the flattening film are formed in a bank of the plurality of banks positioned between adjacent active layers of the plurality of active layers. The upper transparent electrode formed on one of the adjacent active layers and the upper transparent electrode formed on the other of the adjacent active layers are electrically connected via a conductive electrode formed in each of the one or more cut lines.

Advantageous Effects of Disclosure

According to an aspect of the disclosure, an effect is obtained in which pixel defects are unlikely to occur even if the upper transparent electrode is disconnected.

DESCRIPTION OF EMBODIMENTS

Figure 1:
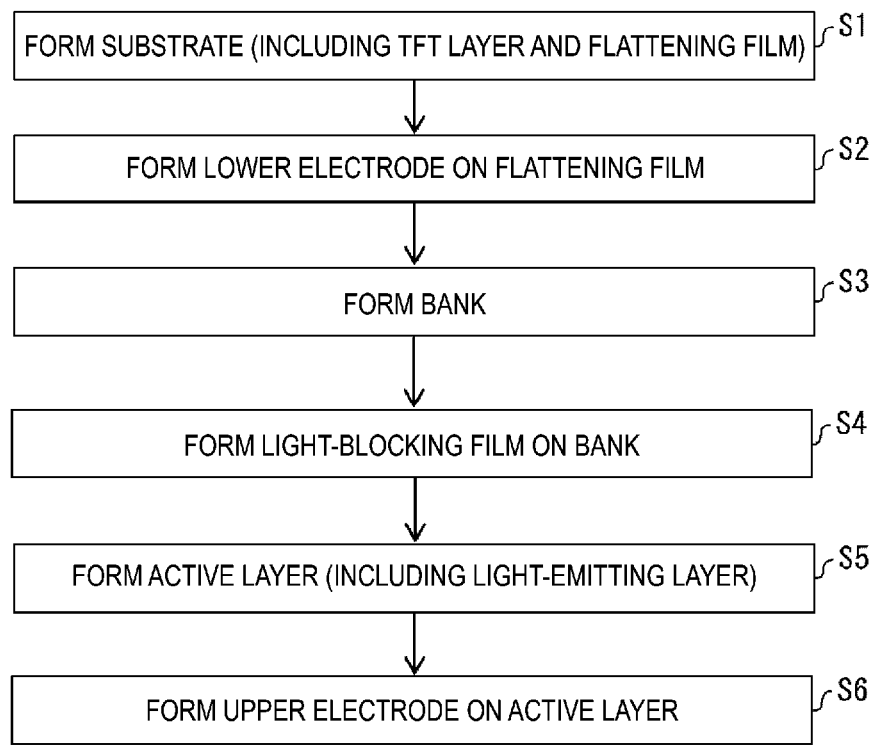
FIG. 1 is a flowchart illustrating steps of forming a display element according to a first embodiment.

In the following, embodiments of the disclosure will be described with reference to the drawings. Note that the configurations illustrated in the drawings are merely examples.

First Embodiment

FIG. 1 is a flowchart illustrating steps of forming a display element according to a first embodiment. FIG. 2(a) is a plan view illustrating a configuration of the display element (display element 2) according to the first embodiment, FIG. 2(b) is a cross-sectional view taken along B-B of FIG. 2(a), and FIG. 2(c) is a cross-sectional view taken along C-C of FIG. 2(a). FIG. 3(a) is a perspective view illustrating the configuration of the display element, FIG. 3(b) is a cross-sectional view taken along B-B of FIG. 3(a), FIG. 3(c) is a plan view illustrating a relationship between a cut line and a droplet, and FIG. 3(d) is a cross-sectional view illustrating another configuration of the cut line.

Figure 2:
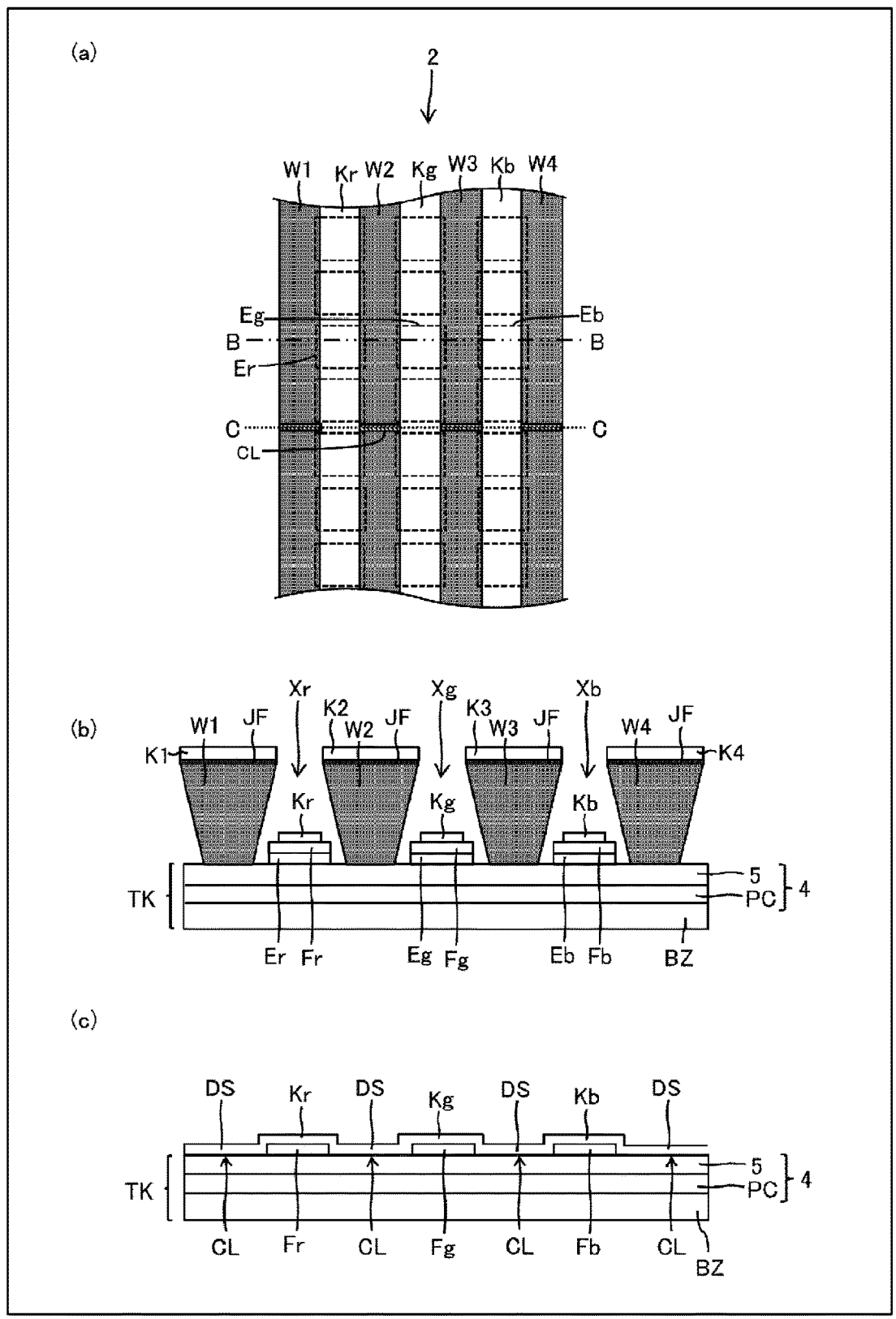
FIG. 2(a) is a plan view illustrating a configuration of the display element according to the first embodiment.
FIG. 2(b) is a cross-sectional view taken along B-B of FIG. 2(a)
FIG. 2(c) is a cross-sectional view taken along C-C of FIG. 2(a).

As illustrated in FIGS. 1 and 2, in step S1, a substrate TK including a base member BZ and a thin film transistor layer (TFT layer) 4 including a pixel circuit layer PC and a flattening film 5 is formed. The base member BZ may be inflexible or flexible, and may be provided with a barrier film (such as an inorganic insulating film) against foreign matters. In step S2, lower reflective electrodes (for example, layered films of ITO and Ag) Er, Eg, Eb are formed on the flattening film 5 using sputtering film formation and photolithography. In step S3, banks W1 to W4, each having a linear shape, are formed using applied film formation and photolithography. In step S4, a light-blocking film JF is formed on the banks W1 to W4 using applied film formation and photolithography. In step S5, active layers Fr, Fg, Fb, each having a linear shape (and including a light-emitting layer), are formed using an ink-jet method or vapor deposition. In step S6, upper transparent electrodes Kr, Kg, Kb (electrode thin films of Al or Ag, Au, Pt, Ni, Ir, Ca, or an MgAg alloy, or an ITO film or an IZO film, for example) having a linear shape are formed on the active layers Fr, Fg, Fb by vapor film deposition. After step S6, a sealing process may be performed to prevent foreign matters such as water and oxygen from entering the display element.

Note that, in the present specification, a direction from the TFT layer 4 to the active layer is described as an "upward direction", and a direction from the active layer to the TFT layer 4 is described a "downward direction".

The banks W1 to W4 and the light-blocking film JF are insulators, and bank electrodes K1 to K4 are formed on the light-blocking film JF (above the banks W1 to W4). The bank electrodes K1 to K4 are formed in the same step as the upper transparent electrodes Kr, Kg, Kb (vapor film deposition of step S6) and are in the same layer as the upper transparent electrodes Kr, Kg, Kb and constituted by the same material. The same power supply voltage is supplied to end portions of the upper transparent electrodes Kr, Kg, Kb.

A red light-emitting element (light-emitting diode (LED)) Xr is constituted by the lower reflective electrode Er, the active layer Fr (including a red light-emitting layer), and the upper transparent electrode Kr, which are superimposed, a green light-emitting element (LED) Xg is constituted by the lower reflective electrode Eg, the active layer Fg (including a green light-emitting layer), and the upper transparent electrode Kg, which are superimposed, a blue light-emitting element (LED) Xb is constituted by the lower transparent electrode Eb, the active layer Fb (including a blue light-emitting layer), and the upper transparent electrode Kb, which are superimposed, and a pixel circuit that controls the light-emitting elements Xr, Xg, Xb is formed in the pixel circuit layer PC of the TFT layer 4.

In addition to the light-emitting layer, the active layers Fr, Fg, Fb may each include at least one of a hole injection layer, a hole transport layer, a hole-blocking layer, an electron injection layer, an electron transport layer, and an electron-blocking layer. The upper transparent electrodes Kr, Kg, Kb each function as a cathode to which a power supply voltage on a low potential side is supplied or an anode to which a power supply voltage on a high potential side is supplied.

In a case in which the light-emitting element is an organic light-emitting diode (OLED; the active layer includes an organic light-emitting layer), positive holes and electrons recombine inside the light-emitting layer in response to a current between the anode and the cathode, and light is emitted when the excitons generated in this manner transition to a ground state. Since the lower reflective electrode has light reflectivity and the upper transparent electrode has transparency, the light emitted from the light-emitting layer travels upwards, whereby a top emission results.

In a case in which the light-emitting element is a quantum dot light-emitting diode (QLED; the active layer includes a quantum dot layer), positive holes and electrons recombine inside the light-emitting layer in response to a current between the anode and the cathode, and light (fluorescence) is emitted when the excitons generated in this manner transition from the conduction band level of the quantum dot to the valence band level. The light-emitting element may be a light-emitting element (such as an inorganic light-emitting diode) other than the OLED or QLED.

Each of the banks W1 to W4 having a linear shape and arranged side-by-side is an inversely tapered type that tapers downward (toward the substrate side). The active layer Fr is formed between the banks W1, W2 and constitutes a red pixel line together with a plurality of the lower reflective electrodes Er and the upper transparent electrode Kr on the active layer Fr aligned in an extending direction of the banks in plan view (extending direction in plan view; vertically in the drawing). The active layer Fg is formed between the banks W2, W3 and constitutes a green pixel line together with a plurality of the lower reflective electrodes Eg and the upper transparent electrode Kg on the active layer Fg aligned in the extending direction of the banks in plan view (vertically). The active layer Fb is formed between the banks W3, W4 and constitutes a blue pixel line together with a plurality of the lower reflective electrodes Eb and the upper transparent electrode Kb on the active layer Fb aligned in the extending direction of the banks in plan view (vertically). A height of the banks W1 to W4 is greater than a height of the upper transparent electrodes Kr, Kg, Kb, with reference to the TFT layer 4 (upper face of the flattening film 5, which is the top layer, for example).

Figure 3:
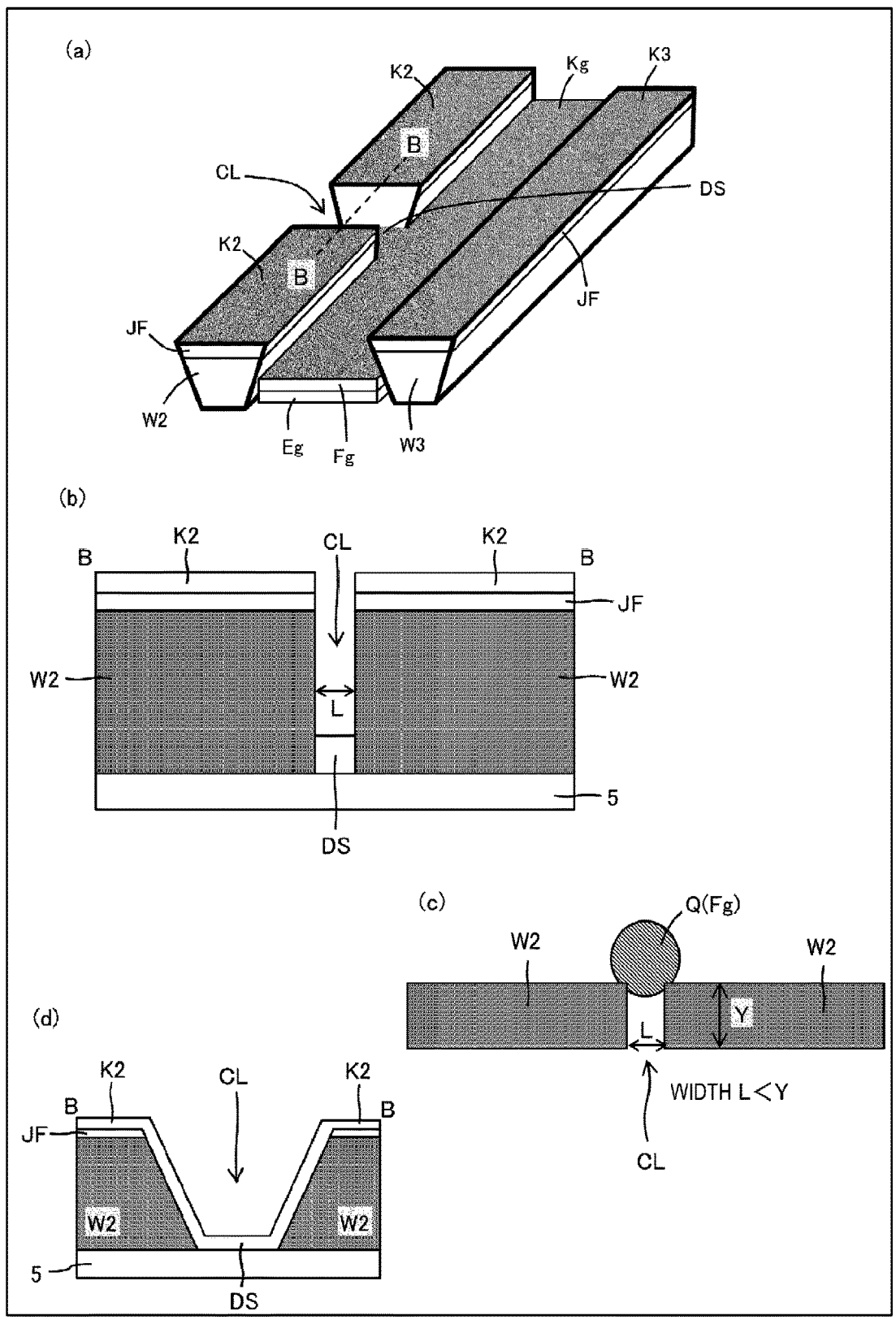
FIG. 3(a) is a perspective view illustrating the configuration of the display element.
FIG. 3(b) is a cross-sectional view taken along B-B of FIG. 3(a)
FIG. 3(c) is a plan view illustrating a relationship between a cut line and a droplet.
FIG. 3(d) is a cross-sectional view illustrating another configuration of the cut line.

As illustrated in FIGS. 2 and 3, for example, one or more cut lines CL having a locally reduced height with reference to the TFT layer 4 are formed in the bank W2 positioned between the adjacent active layers Fr, Fg, and the upper transparent electrode Kr formed on the active layer Fr and the upper transparent electrode Kg formed on the active layer Fg are electrically connected via a conductive electrode DS formed in the one or more cut lines CL.

Further, one or more cut lines CL having a locally reduced height with reference to the TFT layer 4 are formed in the bank W3 positioned between the adjacent active layers Fg, Fb, and the upper transparent electrode Kg formed on the active layer Fg and the upper transparent electrode Kb formed on the active layer Fb are electrically connected via the conductive electrode DS formed in the one or more cut lines CL.

The conductive electrode DS is formed in the same step as the upper transparent electrodes Kr, Kg, Kb (step S6 in FIG. 1) and is in the same layer as the upper transparent electrodes Kr, Kg, Kb and constituted by the same material. The bank material penetrates the cut lines CL of the banks W2, W3 (has a height of zero), and the conductive electrode DS is formed on the upper face of the flattening film 5.

In FIG. 2, the position of the cut line CL corresponds to a gap of the upper transparent electrode, but is not limited thereto. The cut line CL and the upper transparent electrode may be configured adjacent to each other in plan view.

Figure 4:
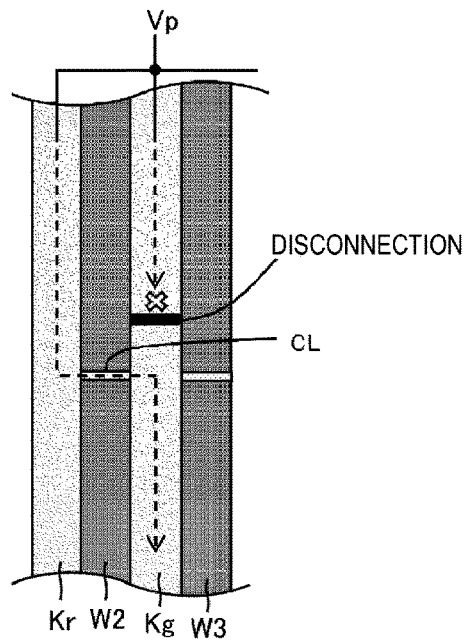
FIG. 4(a) is a plan view illustrating an effect of the cut line in a bank in the first embodiment.
FIG. 4(b) is a plan view illustrating a problem.
Figure 4:
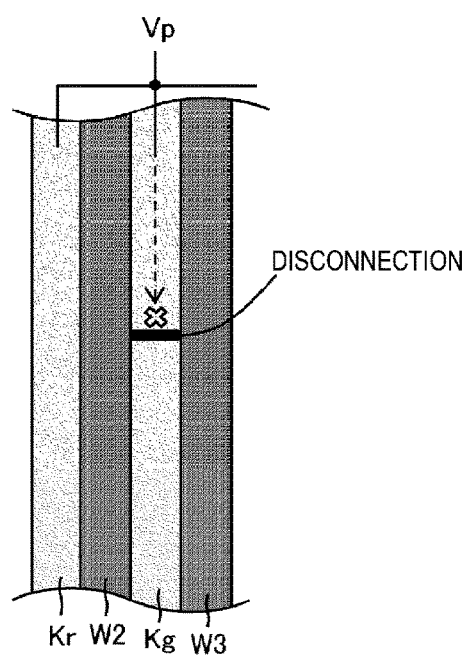

FIG. 4(a) is a plan view illustrating an effect of the cut line in the bank in the first embodiment, and FIG. 4(b) is a plan view illustrating a problem. According to the configuration of FIG. 2 and FIG. 3, the upper transparent electrodes Kr, Kg, each having a linear shape, are electrically connected via the conductive electrode DS. Accordingly, as in FIG. 4(a), even if the upper transparent electrode Kg is disconnected, for example, a power supply voltage Vp is also supplied from the upper transparent electrode Kr through the conductive electrode DS of the cut line CL to the portion after the disconnection location, and thus the portion of the green pixel line after the disconnection location does not become defective (non-illuminating). The cut line CL of each bank is provided to each of a plurality of pixels, and, for example, in a case in which the cut line CL is provided at a position dividing the bank into two equal portions in the extending direction in plan view, the occurrence rate of pixel defects (caused by disconnection of the upper transparent electrode) is reduced by half. With formation of one cut line in two pixels at most, the occurrence of moiré is suppressed.

As in FIG. 4(b), in a case in which there is no cut line or conductive electrode in the bank, if the upper transparent electrode Kg is disconnected, for example, the power supply voltage Vp is not supplied to the portion after the disconnection location, and thus the portion of the pixel line after the disconnection location becomes defective (continually non-illuminating). Note that, even in a case in which the power supply voltage Vp is a double-sided input supplied from both ends of the upper transparent electrode, the portion after the disconnection location becomes a single-sided input, which causes display unevenness.

As in FIGS. 3(b) and 3(c), in order to prevent a droplet Q, which is the material of the active layer Fg, from flowing into the cut line CL of the bank W2 when ejected between the banks W2, W3, it is desirable that a width L of the cut line CL (length in the extending direction of the bank W2 in plan view) at a deepest portion (lowermost portion) of the cut line CL is smaller than a width Y of a bank bottom face. The width L of the cut line CL is preferably 1 µm or less. In a case in which the width L of the cut line CL is not constant, a width that is widest is set as the widest width, and the widest width at the lowermost portion of the cut line CL is preferably smaller than the width Y of the bottom face of the bank, and preferably 1 µm or less.

In FIG. 3(b), the cut line CL is a straight groove (slit) that does not vary in width depending on depth, but is not limited thereto. As in FIG. 3(d), the cut line CL may be a tapered groove (slit) having a width that narrows as the depth increases (toward the TFT layer 4 side). In this way, the conductive electrode DS in the cut line CL and the bank electrode K2 can be electrically connected, and the resistance can be reduced. Further, as long as the bank electrode K2 is supplied with a power supply voltage, the occurrence of pixel defects can be suppressed.

Preferably, sidewalls (tapered faces) of the banks W1 to W4 have liquid repellency. This makes it less likely that a droplet, made of the material of the active layer, will flow into the cut line CL. The liquid repellency of the bank can be realized by mixing a fluorine-based polymer or the like into the bank material.

Preferably, the side walls (tapered faces) of the inversely tapered banks W1 to W4 have light-scattering properties. In this way, light emitted obliquely from the light-emitting layers Fr, Fg, Fb can be emitted efficiently and uniformly (upwardly) from between the banks, and contrast can be increased while ensuring brightness. The light-scattering properties of the bank can be realized by mixing titanium oxide or the like into the bank material.

The light-blocking film JF is formed on upper faces of the banks W1 to W4, and thus external light can be absorbed in the bank upper faces, and an external light reflection by the lower reflective electrode can be suppressed. The light-blocking film JF is formed by patterning an applied black matrix material by photolithography.

FIG. 5(a) is a plan view illustrating another configuration of the display element, FIG. 5(b) is a cross-sectional view taken along B-B of FIG. 5(a), and FIG. 5(c) is a cross-sectional view taken along C-C of FIG. 5(a).

Figure 5:
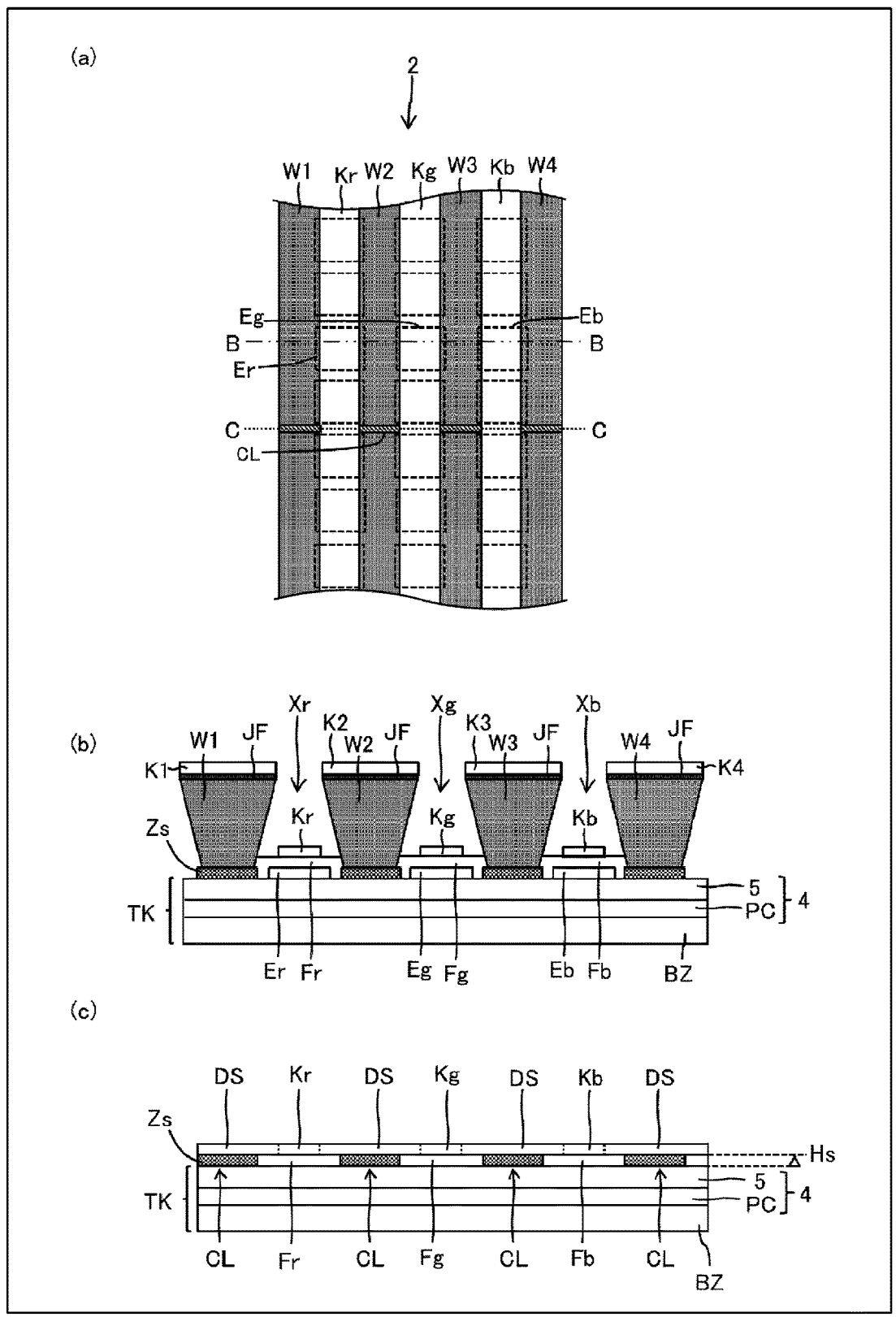
FIG. 5(a) is a plan view illustrating another configuration of the display element.
FIG. 5(b) is a cross-sectional view taken along B-B of FIG. 5(a)
FIG. 5(c) is a cross-sectional view taken along C-C of FIG. 5(a).

As illustrated in FIG. 5, a bank base Zs may be provided between the flattening film 5 and the banks W1 to W4, and only the bank base Zs may penetrate through the bank material and remain in the cut line CL. A height Hs (upper face level) of the bank base Zs and a height (upper face level: about 50 to 200 nm) of a portion of the active layers Fr, Fg, Fb adjacent to the cut line CL with reference to the TFT layer 4 are aligned, thereby aligning the heights of the upper transparent electrodes Kr, Kg, Kb and the conductive electrode DS and making it possible to suppress step disconnection of the conductive electrode DS. Note that a difference between the height of the bank base Zs and a thickness of the active layers Fr, Fg, Fb need not be zero, and may be less than a thickness of the conductive electrode DS. In this way, a step disconnection suppression effect of the conductive electrode DS is confirmed.

FIG. 6(a) is a plan view illustrating yet another configuration of the display element, FIG. 6(b) is a cross-sectional view taken along B-B of FIG. 6(a), and FIG. 6(c) is a cross-sectional view taken along C-C of FIG. 6(a).

Figure 6:
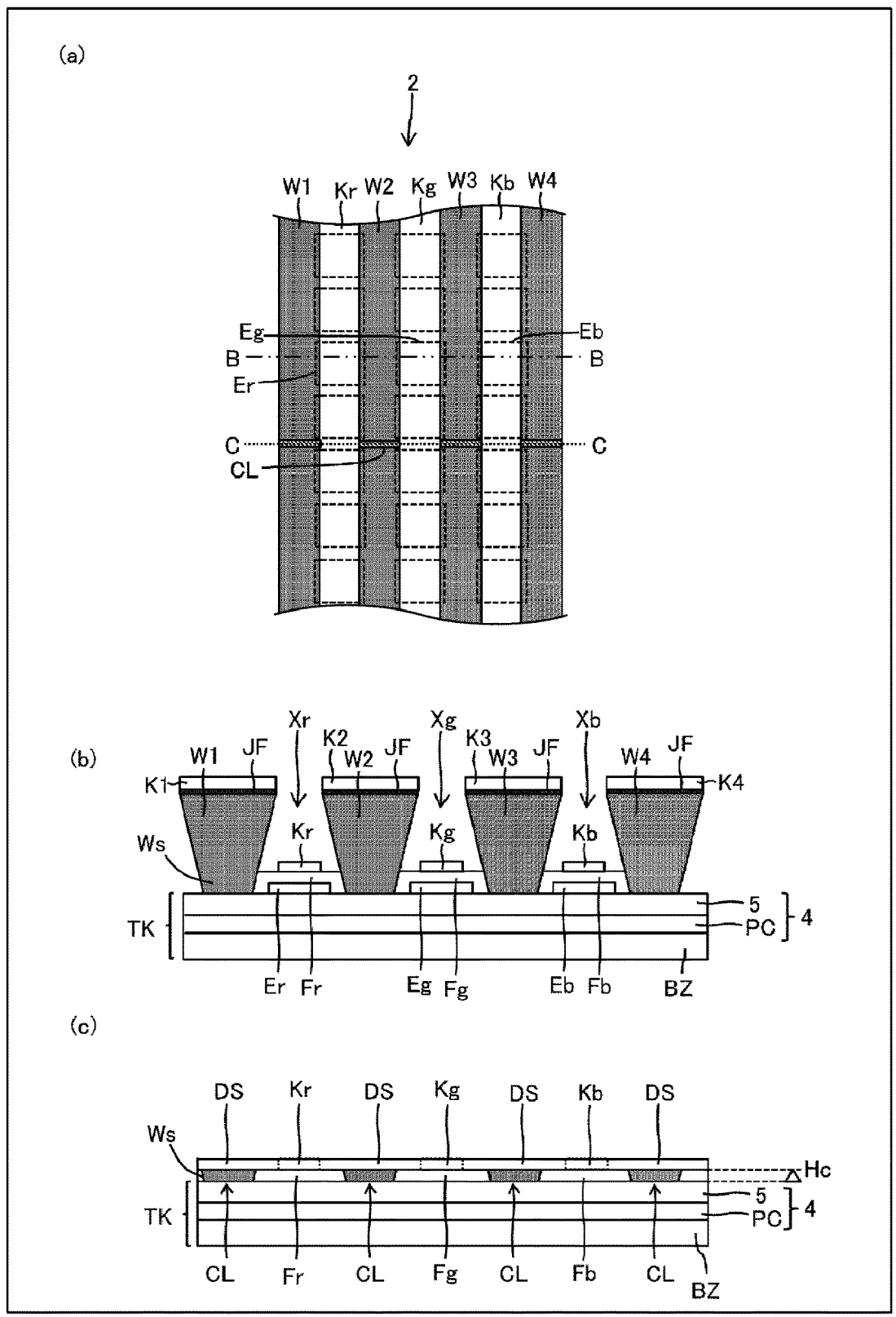
FIG. 6(a) is a plan view illustrating yet another configuration of the display element.
FIG. 6(b) is a cross-sectional view taken along B-B of FIG. 6(a)
FIG. 6(c) is a cross-sectional view taken along C-C of FIG. 6(a).

As illustrated in FIG. 6, in the cut line CL, only a bank portion Ws of the banks W1 to W4 may remain. A height He (upper face level of the base portion Ws) of the deepest portion of the cut line CL and the height (upper face level) of the portion of the active layers Fr, Fg, Fb adjacent to the cut line CL with reference to the TFT layer 4 are aligned, thereby aligning the heights of the upper transparent electrodes Kr, Kg, Kb and the conductive electrode DS and making it possible to suppress step disconnection of the conductive electrode DS.

FIG. 7(a) is a plan view illustrating yet another configuration of the display element, FIG. 7(b) is a cross-sectional view taken along B-B of FIG. 7(a), and FIG. 7(c) is a cross-sectional view taken along C-C of FIG. 7(a).

Figure 7:
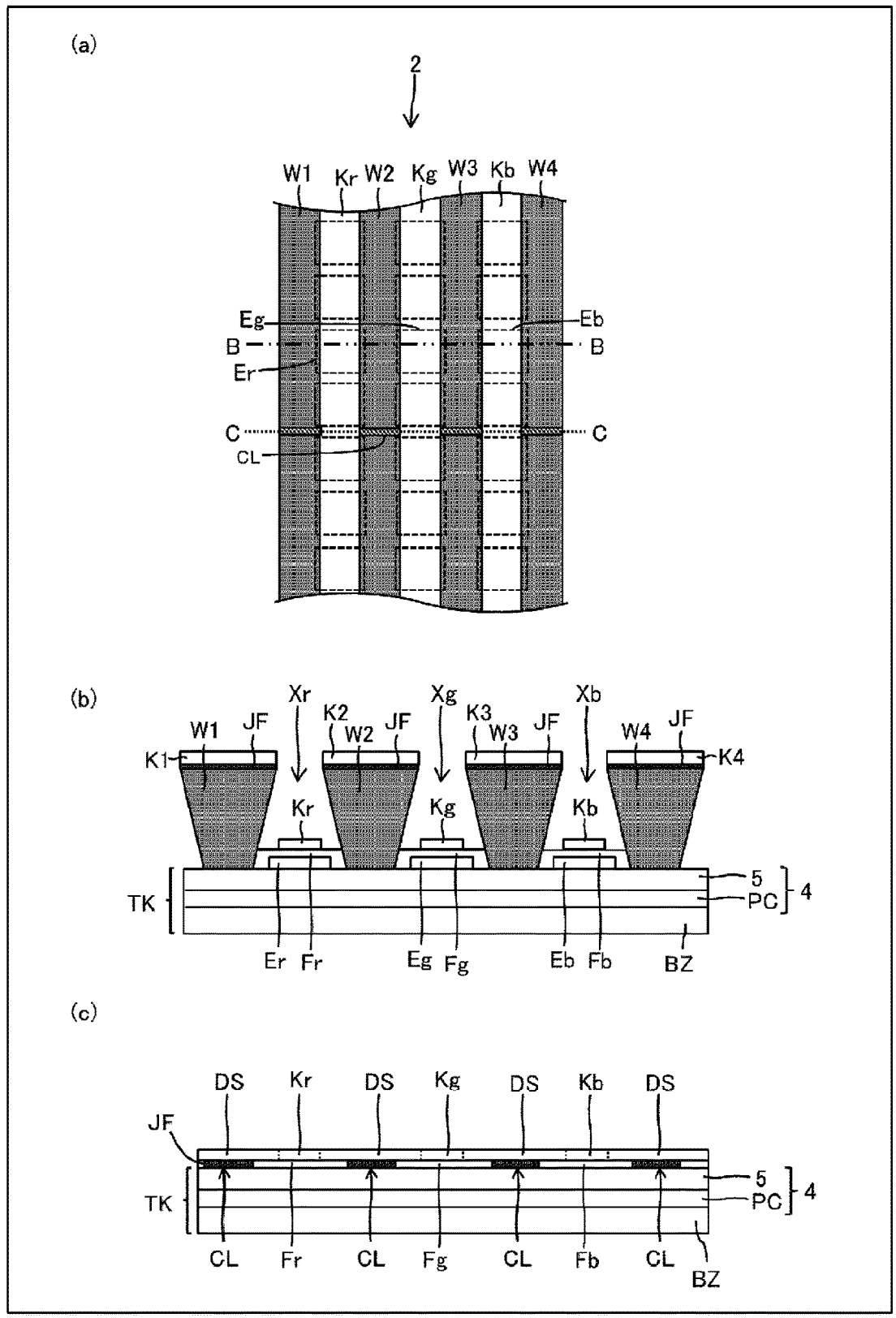
FIG. 7(a) is a plan view illustrating yet another configuration of the display element.
FIG. 7(b) is a cross-sectional view taken along B-B of FIG. 7(a)
FIG. 7(c) is a cross-sectional view taken along C-C of FIG. 7(a).

As illustrated in FIG. 7, the light-blocking film JF may penetrate the bank material and remain in the cut line CL. In this way, external light incidence from the cut line CL can be suppressed. Further, a height (upper face level) of the light-blocking film JF and the height (upper face level) of the portion of the active layers Fr, Fg, Fb adjacent to the cut line CL with reference to the TFT layer 4 are aligned, thereby aligning the heights of the upper transparent electrodes Kr, Kg, Kb and the conductive electrode DS and making it possible to suppress step disconnection of the conductive electrode DS.

Figure 8:
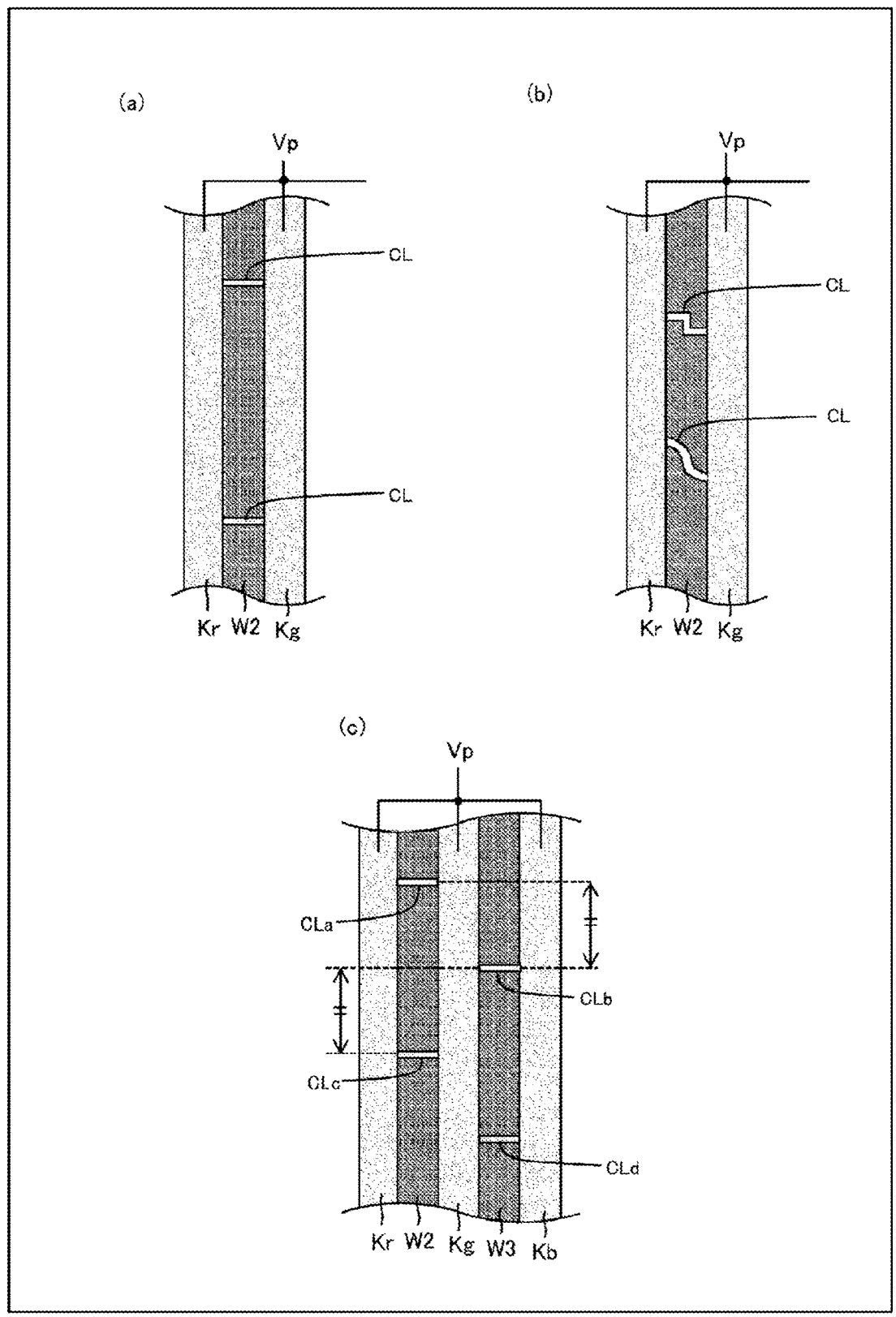
FIGS. 8(a) to 8(c) are plan views illustrating modified examples of the cut line in the first embodiment.

FIGS. 8(a) to 8(c) are plan views illustrating modified examples of the cut line in the first embodiment. As in FIG. 8(a), by providing a plurality of the cut lines CL at positions dividing the bank into N equal portions (N being an integer of 3 or greater) in the extending direction of the bank in plan view, it is possible to set the probability of defect occurrence to 1/N.

Further, as in FIG. 8(b), the cut line CL can be formed into a hook shape or a curved line, and a trace length between both ends of the cut line CL (distance when traced from one end to the other end) is configured to be longer than a shortest distance between both ends, making it possible to suppress mixture of the active layers of different colors caused by droplets passing through the cut line CL.

Further, as in FIG. 8(c), a configuration can also be adopted in which a plurality of the cut lines CL are provided in each bank and, in two adjacent banks, the positions of the cut lines are offset with respect to the extending direction of the banks in plan view. For example, it is also possible to arrange a cut line CLa of the bank W2, a cut line CLb of the bank W3, a cut line CLc of the bank W2, and a cut line CLd of the bank W3 in a zig-zag shape, and make a gap between the cut line CLa and the cut line CLb in the extending direction of the banks in plan view and a gap between the cut line CLc and the cut line CLd in the extending direction of the banks in plan view equal. In this way, even if disconnection occurs in the upper transparent electrode Kg, for example, the portion after the disconnection location can receive the supply of the power supply voltage Vp via at least one of the upper transparent electrode Kr and the upper transparent electrode Kb.

Figure 9:
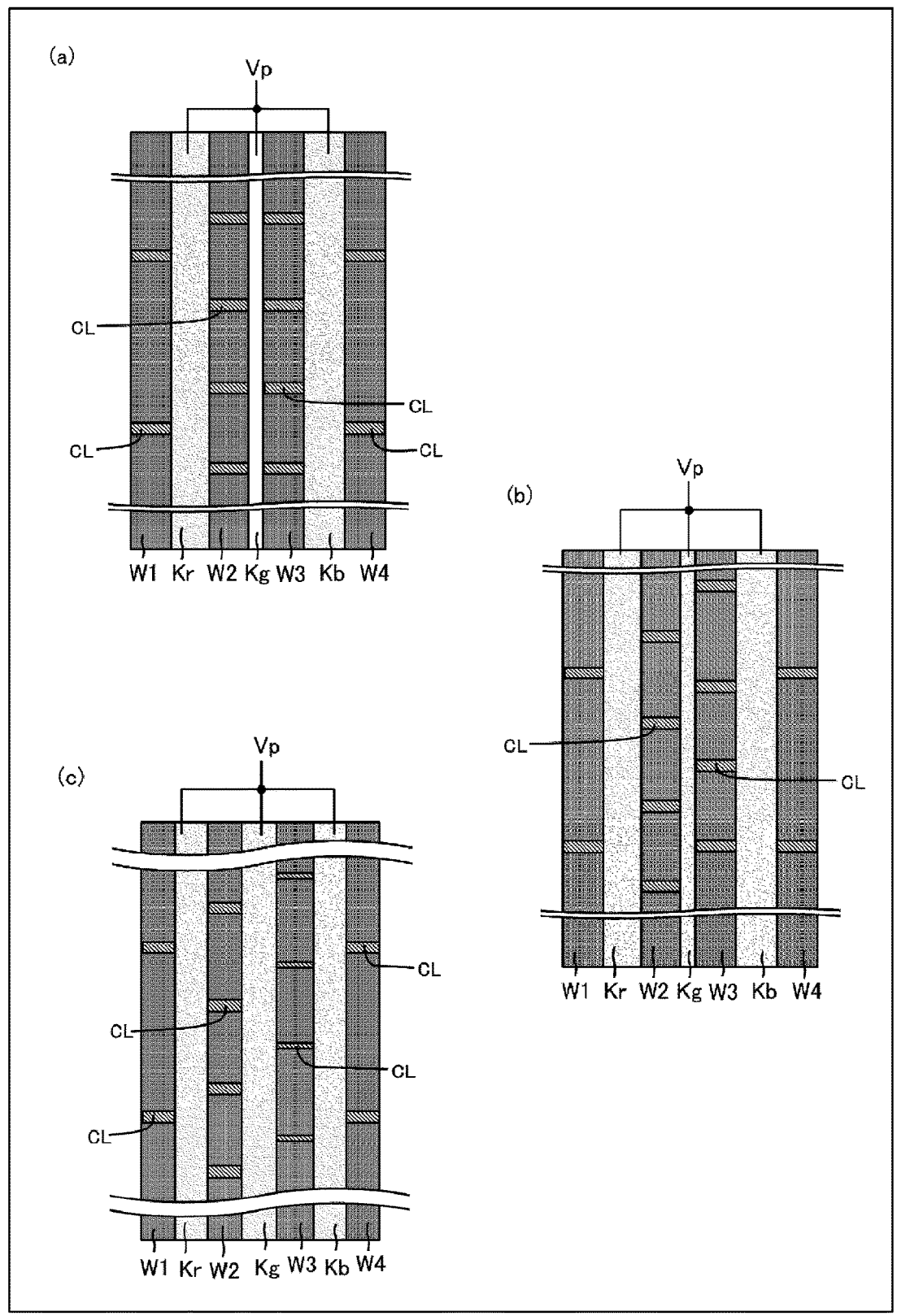
FIGS. 9(a) to 9(c) are plan views illustrating another modified example of the cut line.

FIGS. 9(a) to 9(c) are plan views illustrating another modified example of the cut line. In a case in which the green pixel line (high brightness) is formed narrower than the red and blue pixel lines (low brightness), the upper transparent electrode Kg becomes narrower than the upper transparent electrodes Kr, Kb, making disconnection likely. Here, as in FIG. 9(a), the number of the cut lines CL formed in the banks W2, W3 that sandwich the upper transparent electrode Kg (adjacent to the upper transparent electrode Kg) is greater than the number of the cut lines CL formed in the banks W1, W4, making it possible to suppress defects that occur in the green pixel line. In this case, as in FIG. 9(b), the cut lines CL formed in the bank W2 and the cut lines CL formed in the bank W3 may be offset with respect to the extending direction of the banks in plan view.

At the cut line CL of the bank W3 interposed between a pixel line (green, for example) having a small effective value of a drive voltage and a pixel line (blue, for example) having a large effective value of a drive voltage (adjacent to a green pixel line and a blue pixel line), an active layer that has entered the cut line may unintentionally emit light. Thus, as in FIG. 9(c), by making the width of the cut lines CL formed in the bank W3 smaller than the width of the cut lines CL formed in the banks W1, W2, W4, unintended light emission at the cut line can be suppressed.

Figure 10:
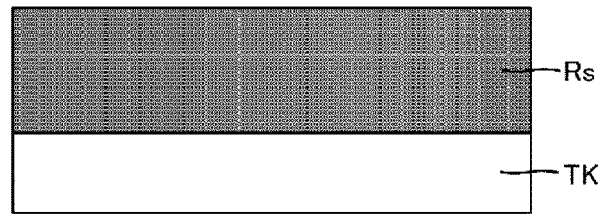
FIGS. 10(a) to 10(c) are cross-sectional views illustrating an example of steps of forming an inversely tapered bank.
Figure 10:
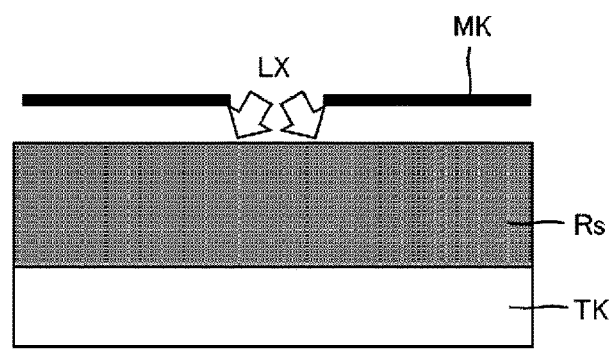
Figure 10:
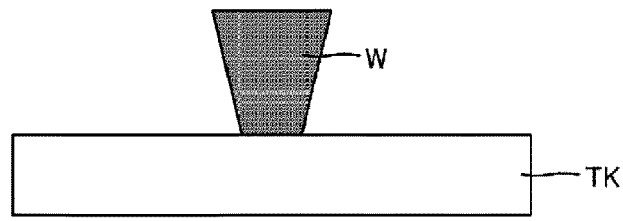
Figure 11:
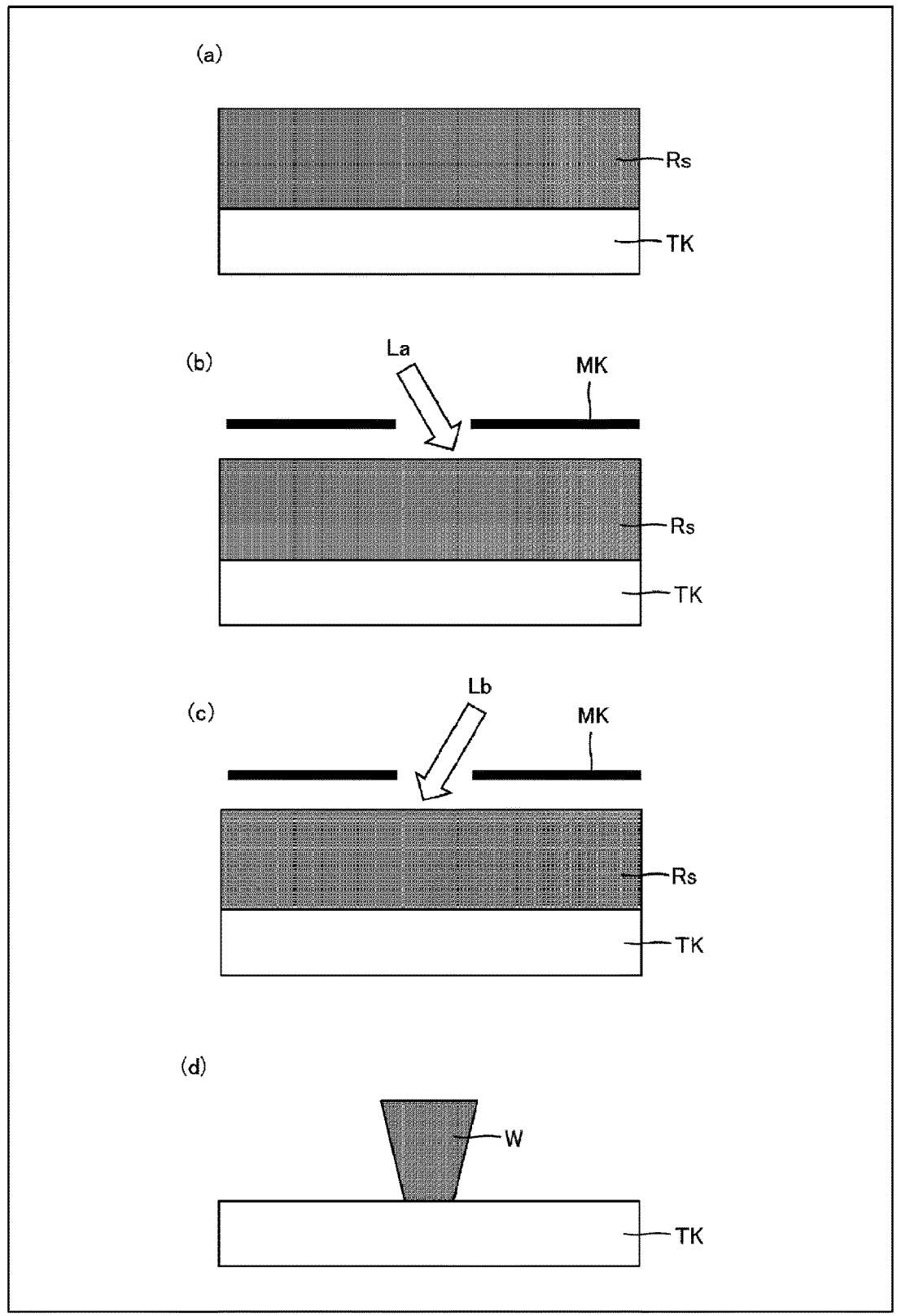
FIGS. 11(a) to 11(d) are cross-sectional views illustrating another example of the steps of forming the inversely tapered bank.
Figure 12:
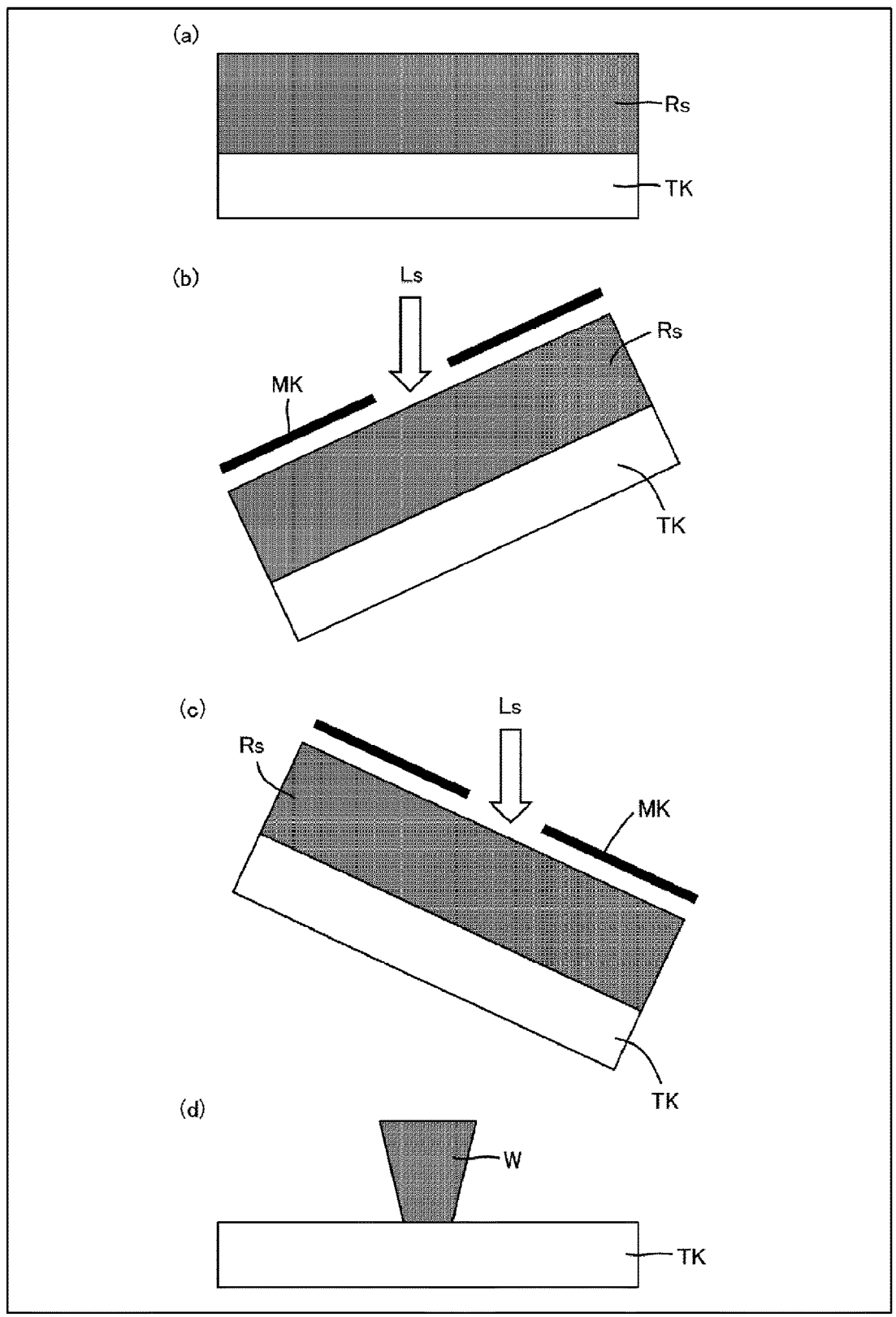
FIGS. 12(a) to 12(d) are cross-sectional views illustrating another example of the steps of forming the inversely tapered bank.

FIGS. 10(a) to 10(c) are cross-sectional views illustrating an example of steps of forming an inversely tapered bank. An inversely tapered bank W can be obtained by applying a resist Rs (bank material) onto the substrate TK (FIG. 10(a)), then irradiating the resist Rs with scattered light LX (including light incident at a positive predetermined acute angle and light incident at a negative predetermined acute angle with respect to a normal line of the substrate) through a mask MK (FIG. 10(b)), and then performing development (FIG. 10(c)).

FIGS. 11(a) to 11(d) are cross-sectional views illustrating another example of the steps of forming the inversely tapered bank. The inversely tapered bank W can be obtained by applying the resist Rs (bank material) onto the substrate TK (FIG. 11(a)), then irradiating the resist Rs with first oblique light La (including light incident at a positive predetermined acute angle with respect to the normal line of the substrate) through the mask MK (FIG. 11(b)), then irradiating the resist Rs with second oblique light Lb (including light incident at a negative predetermined acute angle with respect to the normal line of the substrate) through the mask MK (FIG. 11(c)), and then performing development (FIG. 11(d)).

FIGS. 12(a) to 12(d) are cross-sectional views illustrating another example of the steps of forming the inversely tapered bank. The inversely tapered bank W can be obtained by applying the resist Rs (bank material) onto the substrate TK (FIG. 12(a)), then irradiating the resist Rs with orthogonal light Ls through the mask MK in a state of the mask MK and the substrate TK with the resist Rs being tilted at a positive predetermined acute angle with respect to the orthogonal light Ls (FIG. 12(b)), then irradiating the resist Rs with the orthogonal light Ls through the mask MK in a state of the mask MK and the substrate TK with the resist Rs being tilted at a negative predetermined acute angle with respect to the orthogonal light Ls (FIG. 12(c)), and then performing development (FIG. 12(d)).

Second Embodiment

FIG. 13(a) is a plan view illustrating a configuration of a display element according to a second embodiment, FIG. 13(b) is a cross-sectional view taken along B-B of FIG. 13(a), and FIG. 13(c) is a cross-sectional view taken along C-C of FIG. 13(a). FIG. 14 is a perspective view illustrating a configuration of the display element according to the second embodiment.

Figure 13:
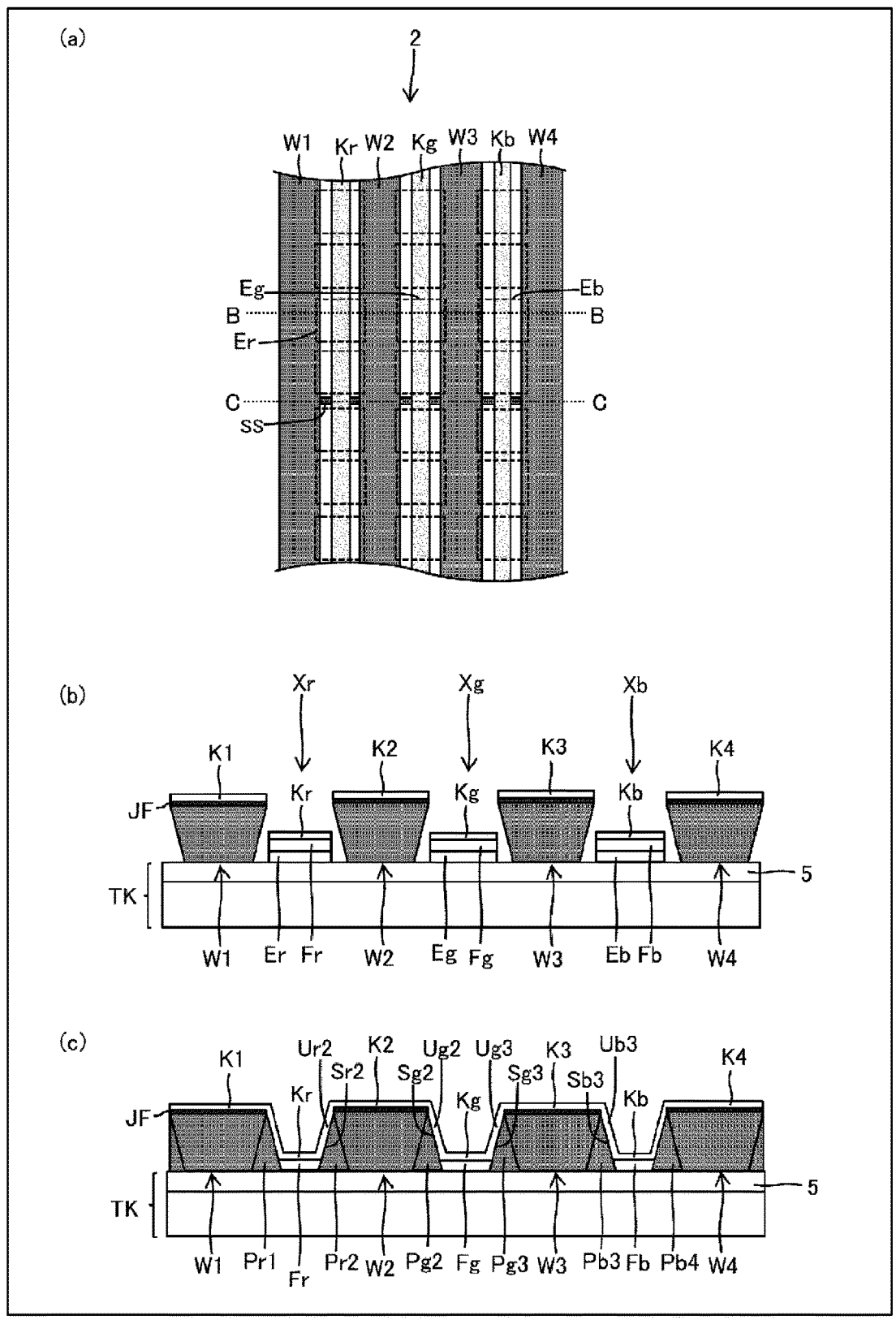
FIG. 13(a) is a plan view illustrating a configuration of a display element according to a second embodiment.
FIG. 13(b) is a cross-sectional view taken along B-B of FIG. 13(a)
FIG. 13(c) is a cross-sectional view taken along C-C of FIG. 13(a).
Figure 14:
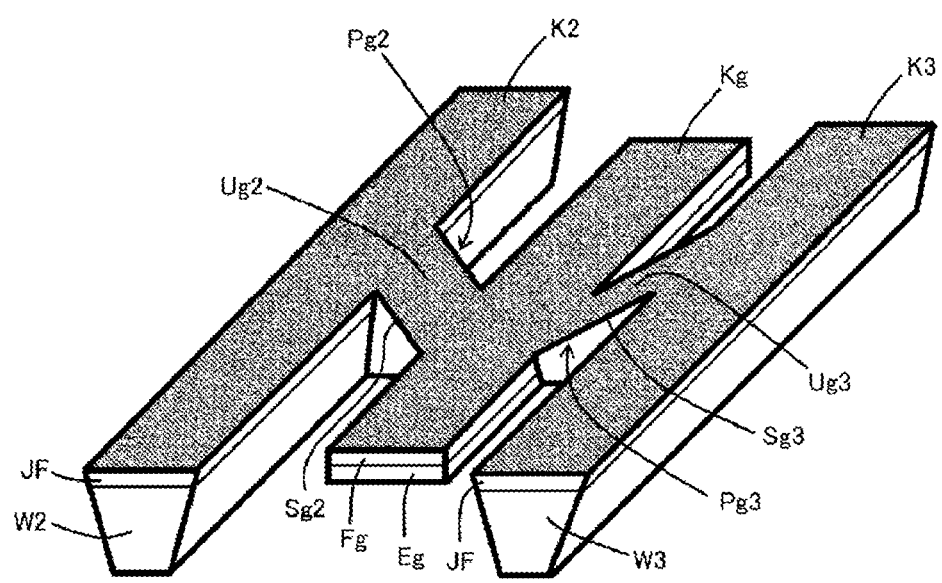
FIG. 14 is a perspective view illustrating a configuration of the display element according to the second embodiment.

As illustrated in FIGS. 13 and 14, the banks W1 to W4 having a linear shape and arranged side-by-side in the second embodiment are inversely tapered downward (toward the substrate side). The active layer Fr is formed between the banks W1, W2 and constitutes a red pixel line together with a plurality of the lower reflective electrodes Er and the upper transparent electrode Kr on the active layer Fr aligned in the extending direction of the banks in plan view (vertically). The active layer Fg is formed between the banks W2, W3 and constitutes a green pixel line together with a plurality of the lower reflective electrodes Eg and the upper transparent electrode Kg on the active layer Fg aligned in the extending direction of the banks in plan view (vertically). The active layer Fb is formed between the banks W3, W4 and constitutes a blue pixel line together with a plurality of the lower reflective electrodes Eb and the upper transparent electrode Kb on the active layer Fb aligned in the extending direction of the banks in plan view (vertically). The height of the banks W1 to W4 is greater than the height of the upper transparent electrodes Kr, Kg, Kb, with reference to the TFT layer 4.

The banks W1 to W4 and the light-blocking film JF are insulators, and the bank electrodes K1 to K4 are formed on the light-blocking film JF (above the banks W1 to W4). The bank electrodes K1 to K4 are formed in the same step as the upper transparent electrodes Kr, Kg, Kb (vapor film deposition of step S6) and are in the same layer as the upper transparent electrodes Kr, Kg, Kb and constituted by the same material. The same power supply voltage is supplied to the bank electrodes K1 to K4 and the upper transparent electrodes Kr, Kg, Kb.

As illustrated in FIGS. 13 and 14, for example, one or more inclined portions Pr2 protruding toward the adjacent active layer Fr and having an inclined face Sr2 inclining from the upper face of the bank W2 toward an upper face of the active layer Fr, and one or more inclined portions Pg2 protruding toward the adjacent active layer Fg and having an inclined face Sg2 inclining from the upper face of the bank W2 toward an upper face of the active layer Fg are formed on the bank W2 positioned between the adjacent active layers Fr, Fg.

The inclined portion Pr2 includes an inclined electrode Ur2 on the inclined face Sr2, the inclined portion Pg2 includes an inclined electrode Ug2 on the inclined face Sg2, the upper transparent electrode Kr and the bank electrode K2 are electrically connected via the inclined electrode Ur2, and the upper transparent electrode Kg and the bank electrode K2 are electrically connected via the inclined electrode Ug2.

Further, one or more inclined portions Pg3 protruding toward the adjacent active layer Fg and having an inclined face Sg3 inclining from the upper face of the bank W3 toward the upper face of the active layer Fg, and one or more inclined portions Pb3 protruding toward the adjacent active layer Fb and having an inclined face Sb3 inclining from the upper face of the bank W3 toward an upper face of the active layer Fb are formed on the bank W3.

The inclined portion Pg3 includes an inclined electrode Ug3 on the inclined face Sg3, the inclined portion Pb3 includes an inclined electrode Ub3 on the inclined face Sb3, the upper transparent electrode Kg and the bank electrode K3 are electrically connected via the inclined electrode Ug3, and the upper transparent electrode Kb and the bank electrode K3 are electrically connected via the inclined electrode Ub3.

Figure 15:
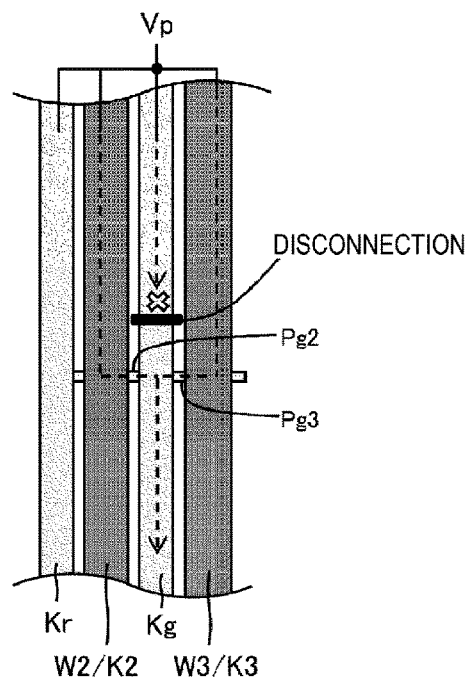
FIG. 15(a) is a plan view illustrating an effect of an inclined portion in the second embodiment.
FIG. 15(b) is a plan view illustrating a problem.
Figure 15:
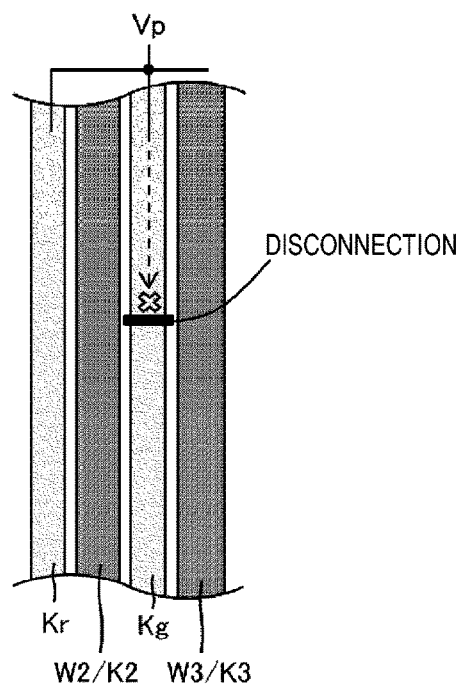

FIG. 15(a) is a plan view illustrating an effect of the inclined portion in the second embodiment, and FIG. 15(b) is a plan view illustrating a problem. According to the configuration of FIG. 13 and FIG. 14, for example, the upper transparent electrode Kg having a linear shape is electrically connected to the bank electrodes K2, K3 via the inclined portions Pg2, Pg3. Accordingly, as in FIG. 15(a), even if the upper transparent electrode Kg is disconnected, for example, the power supply voltage Vp is also supplied to a portion other than the disconnected location by a path via the bank electrode K2 and the inclined portion Pg2 of the bank W2 and by a path via the bank electrode K3 and the inclined portion Pg3 of the bank W3, and thus the portion of the green pixel line after the disconnection location does not become defective (non-illuminating). For example, by providing one inclined portion Pg2 at a center of the bank W2, it is possible to reduce the defect occurrence rate of the green pixel line by half.

As in FIG. 15(b), in a case in which the inclined portions Pg2, Pg3 are not provided, if the upper transparent electrode Kg is disconnected, for example, the power supply voltage Vp is not supplied to the portion after the disconnection location, and thus the portion of the pixel line after the disconnection location becomes defective (continually non-illuminating).

Figure 16:
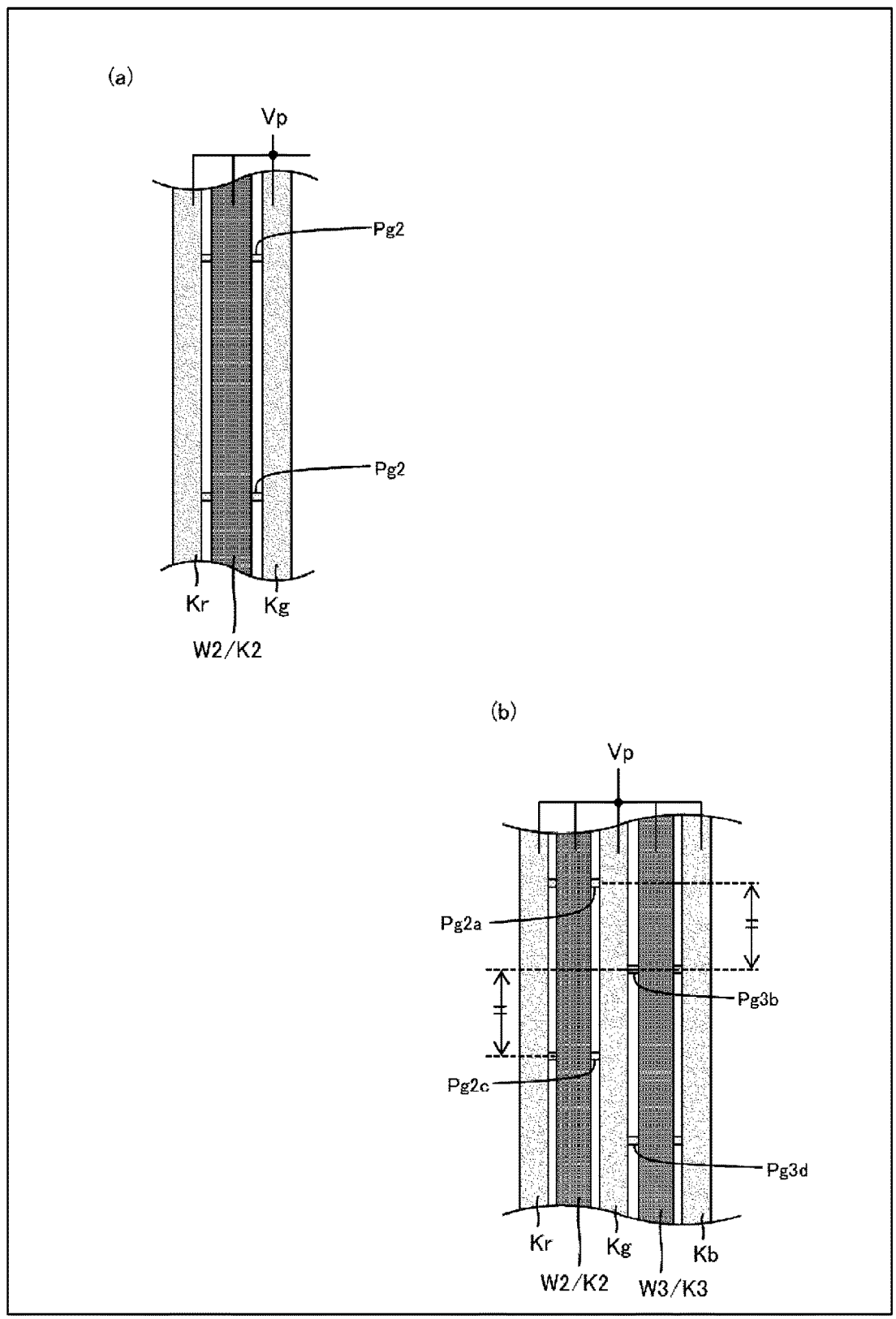
FIGS. 16(a) and 16(b) are plan views illustrating modified examples of the inclined portion in the second embodiment.

FIGS. 16(a) and 16(b) are plan views illustrating modified examples of the inclined portion in the second embodiment. As in FIG. 16(a), by forming, on the bank W2, a plurality of the inclined portions Pg2 in positions that divide the bank W2 into N equal portions (N being an integer of 3 or greater) in the extending direction of the bank in plan view, for example, it is possible to set the probability of defect occurrence to 1/N.

Further, as in FIG. 16(b), a configuration can also be adopted in which a plurality of the inclined portions are provided in each bank and, in two adjacent banks, the positions of the inclined portions are offset with respect to the extending direction of the banks in plan view. For example, it is also possible to arrange an inclined portion Pg2a of the bank W2, an inclined portion Pg3b of the bank W3, an inclined portion Pg2C of the bank W2, and an inclined portion Pg3d of the bank W3 in a zig-zag shape, and make a gap between the inclined portion Pg2a and the inclined portion Pg3b in the extending direction of the banks in plan view and a gap between the inclined portion Pg2c and the inclined portion Pg3d in the extending direction of the banks in plan view equal. In this way, even if disconnection occurs in the upper transparent electrode Kg, for example, the portion after the disconnection location can receive the supply of the power supply voltage Vp via at least one of the bank electrode K2 and the bank electrode K3.

Figure 17:
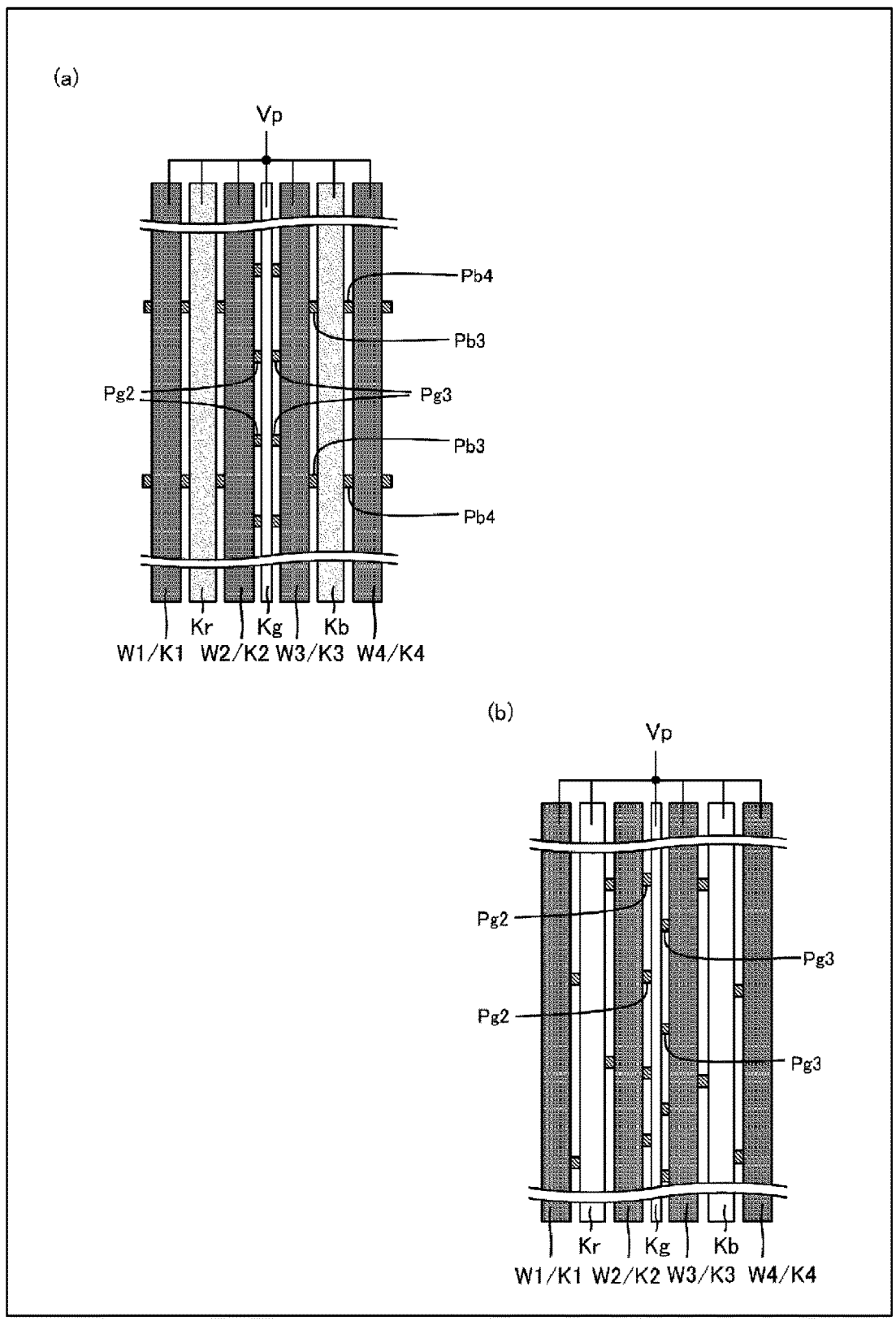
FIGS. 17(a) and 17(b) are plan views illustrating other modified examples of the inclined portion.

FIGS. 17(a) and 17(b) are plan views illustrating other modified examples of the inclined portion. In a case in which the green pixel line (high brightness) is formed narrower than the red and blue pixel lines (low brightness), the upper transparent electrode Kg becomes narrower than the upper transparent electrodes Kr, Kb, making disconnection likely. Here, as in FIG. 17(a), by making the number of the inclined portions Pg2, Pg3 adjacent to the upper transparent electrode Kg having the smallest width greater than the number of inclined portion Pb3, Pb4 adjacent to the transparent electrode Kb having a width greater than that of the upper transparent electrode Kg, it is possible to more effectively suppress defects that occur in the green pixel line. In this case, as in FIG. 17(b), the inclined portion Pg2 formed in the bank W2 and the inclined portion Pg3 formed in the bank W3 may be offset with respect to the extending direction of the banks in plan view.

The embodiments described above are for the purpose of illustration and description and are not intended to be limiting. It will be apparent to those skilled in the art that many variations are possible in accordance with these illustrated examples and descriptions.

The invention claimed is:

1. A display element comprising:
    a thin film transistor (TFT) layer;
    a plurality of lower reflective electrodes;
    a plurality of banks each having a linear shape;
    a plurality of active layers each having a linear shape and formed between adjacent banks of the plurality of banks; and
    an upper transparent electrode formed on each of the plurality of active layers,
    wherein the plurality of lower reflective electrodes, the plurality of banks, the plurality of active layers, and the upper transparent electrode are on an upper side of the TFT layer,
    each of the plurality of active layers is provided in common to the plurality of lower reflective electrodes and forms a plurality of same color pixels,
    each of the plurality of banks is inversely tapered toward a TFT layer side,
    a height of each of the plurality of banks with reference to the TFT layer is greater than a height of the upper transparent electrode with reference to the TFT layer,
    one or more cut lines having a locally reduced height with reference to the TFT layer are formed in a bank of the plurality of banks positioned between adjacent active layers of the plurality of active layers,
    the upper transparent electrode formed on one of the adjacent active layers and the upper transparent electrode formed on the other one of the adjacent active layers are electrically connected via a conductive electrode formed in the one or more cut lines,
    the one or more cut lines and the conductive electrode are formed in each of the plurality of banks, and
    a first cut line and a second cut line of the adjacent banks with one active layer of the plurality of active layers interposed therebetween are offset with respect to an extending direction of the plurality of banks in a plan view.

2. The display element according to claim 1,
wherein a light-blocking film is formed on an upper face of each of the plurality of banks.

3. The display element according to claim 1,
wherein a light reflective film or a light-scattering film is formed on a tapered face of each of the plurality of banks.

4. The display element according to claim 1,
wherein a widest width of a lowermost portion of each of the one or more cut lines is smaller than a width of a bottom face of the bank.

5. The display element according to claim 4,
wherein the widest width is 1 um or less.

6. The display element according to claim 1,
wherein each of the one or more cut lines is provided in at least one position equally dividing the bank positioned between the adjacent active layers into a predetermined quantity in a longitudinal direction.

7. The display element according to claim 1,
wherein one of the one or more cut lines is provided to the plurality of same color pixels.

8. The display element according to claim 1,
wherein each bank of the plurality of banks is formed on a bank base, and
a difference between a height of the bank base and a height of a portion of the adjacent active layers adjacent to the one or more cut lines is less than a thickness of the upper transparent electrode, with reference to the TFT layer.

9. The display element according to claim 1,
wherein cut lines of the one or more cut lines of two adjacent banks of the plurality of banks are offset with respect to the extending direction of the plurality of banks in the plan view.

10. The display element according to claim 1,
wherein cut lines of the one or more cut lines of two adjacent banks of the plurality of banks are disposed in a zig-zag shape with respect to the extending direction of the plurality of banks in the plan view.

11. The display element according to claim 1,
wherein a height of a deepest portion of the one or more cut lines and a height of a portion of the adjacent active layers adjacent to the one or more cut lines are equal, with reference to the TFT layer.

12. The display element according to claim 2,
wherein the light-blocking film is formed in each of the one or more cut lines.

13. The display element according to claim 1,
wherein the upper transparent electrode and the conductive electrode are formed in a same layer and of a same material.

14. The display element according to claim 1,
wherein a trace length between both ends of each of the one or more cut lines is longer than a shortest distance between the both ends.

15. The display element according to claim 1,
a number of the one or more cut lines, formed in a bank of the plurality of banks adjacent to the upper transparent electrode having a smallest width, is greater than a number of the one or more cut lines formed in a bank of the plurality of banks not adjacent to the upper transparent electrode having the smallest width.

16. The display element according to claim 1,
a cut line of the one or more cut lines, formed in a bank of the plurality of banks adjacent to two active layers of the plurality of active layers having a largest effective value and a smallest effective value of a drive voltage, is narrower than a cut line of the one or more cut lines formed in a bank of the plurality of banks adjacent only to one of the two active layers.

17. The display element according to claim 1,
wherein one or more inclined portions and an inclined electrode are formed on each of the plurality of banks, and
a number of the one or more inclined portions adjacent to the upper transparent electrode having a smallest width is greater than a number of the one or more inclined portions adjacent to the upper transparent electrode not having the smallest width.

18. A display element comprising:
a thin film transistor (TFT) layer;
a plurality of lower reflective electrodes;
a plurality of banks each having a linear shape;
a plurality of active layers each having a linear shape and formed between adjacent banks of the plurality of banks; and
an upper transparent electrode formed on each of the plurality of active layers,
wherein the plurality of lower reflective electrodes, the plurality of banks, the plurality of active layers, and the upper transparent electrode are on an upper side of the TFT layer,
each of the plurality of active layers is provided in common to the plurality of lower reflective electrodes and forms a plurality of same color pixels,
each of the plurality of banks is inversely tapered toward a TFT layer side,
a height of each of the plurality of banks with reference to the TFT layer is greater than a height of the upper transparent electrode with reference to the TFT layer,
one or more cut lines having a locally reduced height with reference to the TFT layer are formed in a bank of the plurality of banks positioned between adjacent active layers of the plurality of active layers,
the upper transparent electrode formed on one of the adjacent active layers and the upper transparent electrode formed on the other one of the adjacent active layers are electrically connected via a conductive electrode formed in the one or more cut lines, and
the one or more cut lines narrow in width while increasing in depth in an extending direction of the plurality of banks in a plan view.

19. A display element comprising:
a thin film transistor (TFT) layer;
a plurality of lower reflective electrodes;
a plurality of banks each having a linear shape;
an active layer having a linear shape and formed between first and second banks of the plurality of banks adjacent to each other; and
an upper transparent electrode formed on the active layer,
wherein the plurality of lower reflective electrodes, the plurality of banks, the active layer, and the upper transparent electrode are on an upper side of the TFT layer,
the active layer is provided in common to the plurality of lower reflective electrodes and forms a plurality of same color pixels,
each of the first and second banks is inversely tapered toward a TFT layer side,
a height of each of the first and second banks with reference to the TFT layer is greater than a height of the upper transparent electrode with reference to the TFT layer, a bank electrode is formed above each of the first and second banks, one or more inclined portions, protruding toward the active layer and including an inclined face inclined from a bank upper face toward an upper face of the active layer, is formed on each of the first and second banks, the one or more inclined portions further include an inclined electrode on the inclined face, the upper transparent electrode and the bank electrode are electrically connected via the inclined electrode, and the one or more inclined portions of the first bank and the one or more inclined portions of the second bank are positionally offset with respect to an extending direction of the first and second banks in a plan view.

20. The display element according to claim 19, wherein a light-blocking film is formed on an upper face of each of the first and second banks.

21. The display element according to claim 19, wherein the upper transparent electrode, the bank electrode, and the inclined electrode are formed in a same layer and of a same material.

* * * * *